(12) United States Patent
Jain et al.

(10) Patent No.: US 9,916,040 B2
(45) Date of Patent: Mar. 13, 2018

(54) CAPACITOR, FIRST AND SECOND CURRENT CONVEYORS MIRROR CURRENT INTO INPUT

(71) Applicant: Texas Instruments Incorporated, Dallas, TX (US)

(72) Inventors: Karan Singh Jain, Dallas, TX (US); Harish Venkataraman, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/369,104

(22) Filed: Dec. 5, 2016

(65) Prior Publication Data

US 2017/0083161 A1   Mar. 23, 2017

Related U.S. Application Data

(62) Division of application No. 13/973,049, filed on Aug. 22, 2013, now Pat. No. 9,513,741.

(51) Int. Cl.
| | |
|---|---|
| *G06F 3/041* | (2006.01) |
| *H03K 17/96* | (2006.01) |
| *G06F 3/044* | (2006.01) |
| *H03H 11/04* | (2006.01) |

(52) U.S. Cl.
CPC ............ *G06F 3/0418* (2013.01); *G06F 3/044* (2013.01); *H03H 11/11* (2013.01); *H03K 17/962* (2013.01); *H03K 2217/960735* (2013.01)

(58) Field of Classification Search
CPC .......... G06F 3/044; G06F 2203/04111; G06F 2203/04112
USPC ....................... 345/174; 178/18.06
See application file for complete search history.

(56) References Cited

U.S. PATENT DOCUMENTS

| | | | |
|---|---|---|---|
| 7,633,280 B2 | 12/2009 | Ivanov et al. | |
| 8,477,120 B2 | 7/2013 | Jang et al. | |
| 2009/0153152 A1 | 6/2009 | Maharyta et al. | |
| 2009/0322351 A1 | 12/2009 | McLeod | |
| 2012/0049868 A1 | 3/2012 | Maharyta | |
| 2012/0262387 A1 | 10/2012 | Mizuhashi et al. | |

OTHER PUBLICATIONS

Prosecution History from U.S. Appl. No. 13/973,049, dated Aug. 22, 2013 to Nov. 17, 2016, 249 pp.

*Primary Examiner* — Stephen Sherman
(74) *Attorney, Agent, or Firm* — Lawrence J. Bassuk; Charles A. Brill; Frank D. Cimino

(57) ABSTRACT

A bandpass sense amplifier circuit (FIG. 2A) is disclosed. The circuit includes a capacitor (C0) having a first terminal coupled to receive an input signal (Vin) and a second terminal. A current conveyor circuit (200-206,212) has a third terminal (X) coupled to the second terminal of the capacitor and a fourth terminal (Z) arranged to mirror a current into the third terminal. A voltage follower circuit (214) has an input terminal coupled to the fourth terminal of the current conveyor circuit and an output terminal.

11 Claims, 7 Drawing Sheets

| | SALLEN KEY | FIGURE 2A | FIGURE 3 |
|---|---|---|---|
| CAPACITANCE | Cf=22pf, C1=4pf, C2=3.75pf | C1=3.5pf, C4=18pf | C1=3.5pf, C4=18pf |
| RESISTANCE | R1=R2=Rf=500KΩ, Rf1=400KΩ, Rf2=100KΩ, Rf3=200KΩ | R2=155KΩ, R3=180KΩ | R2=155KΩ, R3=254KΩ |
| Q | 1.38 | 1.15 | 1.49 |
| F0 | 115KHz | 115KHz | 115KHz |
| BW | 82KHz | 101KHz | 77KHz |
| GAIN | -5.8dB | -6.0dB | -5.9dB |
| NOISE @ 115KHz | 698nV/sqrt(Hz) | 73nV/sqrt(Hz) | 84nV/sqrt(Hz) |
| NOISE 90KHz-140KHz | 177μV | 14μV | 18μV |
| THD @ 115KHz (3V IN) | -36dB | -44dB | -39dB |

CAPACITOR, FIRST AND SECOND CURRENT CONVEYORS MIRROR CURRENT INTO INPUT

RELATED APPLICATIONS

This patent application is a divisional of U.S. patent application Ser. No. 13/973,049, filed Aug. 22, 2013, now U.S. Pat. No. 9,513,741, issued Dec. 6, 2016, which is incorporated herein by reference in its entirety.

BACKGROUND OF THE INVENTION

Embodiments of the present invention relate to a low noise, current mode capacitive sensor having an integrated bandpass filter.

Touch screen input panels are widely used in cell phones, computer tablets, laptop and desktop computers, video games, and other electronic devices. These panels may be resistive type, light sensing type, or capacitive sensing type. Referring to FIG. 1, there is a capacitive sensing touch screen input system of the prior art as disclosed by Tang et al. (U.S. Pat. No. 8,477,120). The touch screen system includes an array of touch screen cells formed over a liquid crystal display (LCD). The touch screen cells are typically formed where rows of drive electrodes are insulatively disposed proximate columns of sense electrodes. Each drive electrode includes a parasitic capacitance $CD_X$ 102. Here, X is a row number from 0 to N−1 where the array includes N rows. Likewise, each sense electrode includes a parasitic capacitance $CS_Y$ 106. Here, Y is a column number from 0 to M−1 where the array includes M columns. A mutual capacitance is formed at each intersection of a row and column. For example, mutual capacitance $CM_{XY}$ 104 is formed at the intersection of row X and column Y. A drive signal generator 100 generates drive voltage VD on row X, which is applied through mutual capacitance $CM_{XY}$ 104 to sense amplifier 108. When the touch screen cell is touched by a finger or high permittivity stylus, mutual capacitance $CM_{XY}$ 104 increases and produces a high level input signal Vin at sense amplifier 108. Sense amplifier 108 subsequently amplifies this input signal and applies it to processor 110 where it is processed by application software.

There are several problems, however, with this touch screen system. First, row and column selection in the touch screen array produces significant array noise that is coupled to sense amplifier 108. Second, row and column electrodes of the touch screen array act as small antennas and transmit electromagnetic interference (EMI) from various sources such as microwave ovens and electrical appliances to sense amplifier 108. Finally, sense amplifier 108 produces it's own noise. Thus, it is desirable to include a bandpass filter in sense amplifier 108 to attenuate EMI. Turning to FIG. 1B, there is a sense amplifier with integrated bandpass filter of the prior art. The circuit includes a transimpedance amplifier (TIA) coupled in series with a Sallen-Key amplifier configured as a bandpass filter. Laplace transforms of transfer functions of the TIA and the Sallen-Key bandpass amplifier are given by equations [1] and [2], respectively, where K is 1+Rf2/Rf3. The transfer function for the circuit of FIG. 1B, therefore, is a product of equations [1] and [2].

$$H(s)_{TIA} = \frac{sC0Rf1}{sCf1Rf1 + 1} \quad [1]$$

$$H(s)_{S-K} = \frac{\frac{Ks}{R1C1}}{s^2 + s\left(\frac{1}{R1C1} + \frac{1}{R2C1} + \frac{1}{R2C2} - \frac{Rf2}{Rf3RfC1}\right) + \frac{R1 + Rf}{R1RfR2C1C2}} \quad [2]$$

The center frequency and bandwidth of the circuit of FIG. 1B are given below in equations [3] and [4], respectively. The gain and Q factor are given by equations [5] and [6], respectively.

$$\omega_0 = \sqrt{\frac{R1 + Rf}{R1RfR2R1C2}} \quad [3]$$

$$BW = \frac{1}{R1C1} + \frac{1}{R2C1} + \frac{1}{Rf}(1-K) + \frac{1}{R2C2} \quad [4]$$

$$GAIN = \frac{KC0}{R1C1Cf1BW} \quad [5]$$

$$Q = \frac{\sqrt{(R1+R3)R1R3C1C2}}{R1R3(C1+C2) + R2C2\left(R3 - \frac{Rf2}{Rf3}R1\right)} \quad [6]$$

There are several significant limitations of the circuit of FIG. 1B. Both bandwidth (BW) and center frequency ($\omega_0$) depend on passive components R1, R2, Rf, C1, and C2. By way of comparison, GAIN depends on K, C0 and inversely on R1, C1, Cf, and BW. Thus, minor process variations may significantly alter circuit performance. Although amplifier GAIN increases with K, it can not be very high or the circuit becomes unstable. Moreover, when K is greater than 1, the circuit does not operate with unity feedback, and total harmonic distortion (THD) increases.

While preceding approaches have provided improvements in touch screen sensing and noise reduction, the present inventors recognize that still further improvements are possible. Accordingly, the preferred embodiments described below are directed toward improving upon the prior art.

BRIEF SUMMARY OF THE INVENTION

In one embodiment of the present invention, a first bandpass sense amplifier circuit is disclosed. The circuit includes a current conveyor circuit having a first terminal coupled to receive an input signal and a second terminal arranged to mirror a current into the first terminal. A voltage follower circuit has an input terminal coupled to the second terminal of the current conveyor circuit and has an output terminal.

In another embodiment of the present invention, a second bandpass sense amplifier circuit is disclosed. The circuit includes a first current conveyor circuit having a first terminal coupled to receive an input signal and a second terminal arranged to mirror a current into the first terminal. A second current conveyor circuit has an input terminal coupled to the second terminal of the first current conveyor circuit and has an output terminal arranged to mirror a current into the input terminal.

In yet another embodiment of the present invention, a touch screen system is disclosed. The system includes a voltage source arranged to produce a drive voltage. A plurality of first electrodes is arranged to selectively receive the drive voltage. A plurality of second electrodes are formed proximate the plurality of first electrodes. A bandpass sense amplifier, including a current conveyor circuit and a voltage follower circuit, is selectively coupled to the plurality of second electrodes. An analog to digital converter coupled to receive an output signal from the bandpass sense amplifier. A processor is coupled to receive an output signal from the analog to digital converter.

DETAILED DESCRIPTION OF THE INVENTION

The preferred embodiments of the present invention provide significant advantages over touch screen circuits of the prior art as will become evident from the following detailed description.

Figures 6, 7:
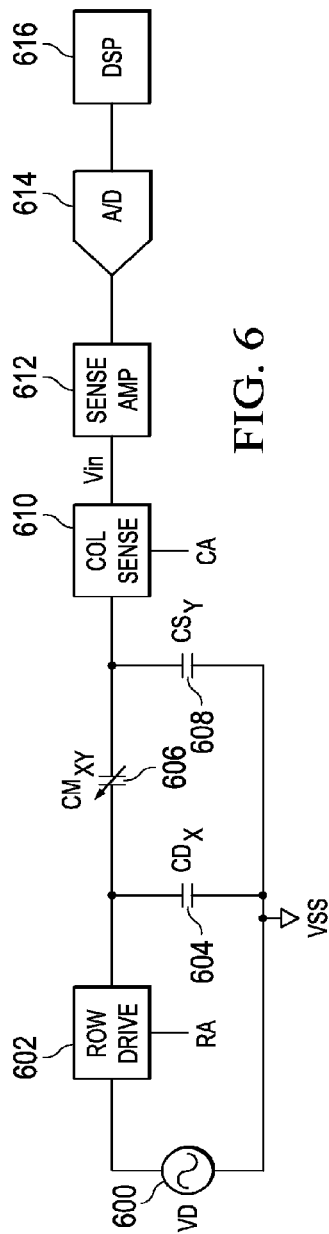
FIG. 6 is a circuit diagram of a touch screen system of the present invention that may use bandpass sense amplifier circuits of FIGS. 2A and 3.
FIG. 7 is a diagram comparing characteristics of the circuit of FIG. 1B with the circuits of FIGS. 2A and 3.

Referring to FIG. 6, there is a circuit diagram of a touch screen system of the present invention. The system includes an array of touch screen cells formed by plural rows of drive electrodes and columns of sense electrodes. Touch screen cells are formed where rows of drive electrodes are insulatively disposed proximate columns of sense electrodes. Each drive electrode includes a parasitic capacitance $CD_X$ 604. Here, X is a row number from 0 to N−1 where the array includes N rows. Likewise, each sense electrode includes a parasitic capacitance $CS_Y$ 608. Here, Y is a column number from 0 to M−1 where the array includes M columns. A mutual capacitance is formed at each intersection of a row and column. For example, mutual capacitance $CM_{XY}$ 606 is formed at the intersection of row X and column Y. Row and column electrodes are preferably formed over a conventional visual display such as a liquid crystal display (LCD), light emitting diode (LED) display, or other suitable display. The system further includes a drive signal generator 600, a row drive circuit 602, and a column sense circuit 610. A bandpass sense amplifier circuit 612 is coupled to receive and amplify a selected input signal Vin as will be explained in detail. An analog to digital converter 614 receives the amplified signal and converts it to a digital signal, which is subsequently applied to digital signal processor 616.

In operation, drive signal generator 600 generates drive voltage VD having a constant frequency on row X. This constant frequency is approximately equal to the center frequency of bandpass sense amplifier 612. A row address (RA) corresponding to a row on the visual display is applied to row drive circuit 602. The row drive circuit selectively applies drive voltage VD to one of the N rows as determined by the row address. The drive voltage is applied through mutual capacitance $CM_{XY}$ 606 to each of M column sense electrodes along row X. When a touch screen cell is touched by a finger or high permittivity stylus at array position XY, mutual capacitance $CM_{XY}$ 606 increases and produces a high level signal at parasitic capacitance $CS_Y$ 608. Column sense circuit 610 receives a sequence of column addresses (CA) for each row address and sequentially applies the respective signal voltage on each column sense electrode to bandpass sense amplifier 612. The signal voltage at column Y is significantly greater than at other columns due to the increased mutual capacitance $CM_{XY}$ 606 and produces input signal Vin at sense amplifier 612. Sense amplifier 612 subsequently amplifies this input signal and applies it to analog to digital converter 614. Digital signal processor 616 receives a respective digital signal corresponding to each column sense electrode and determines from the amplitude that only the sense electrode on row X and column Y has been touched. The digital signal processor sends the detected screen address to appropriate application software where it is processed as determined by the address of the corresponding visual display.

Figure 2A:
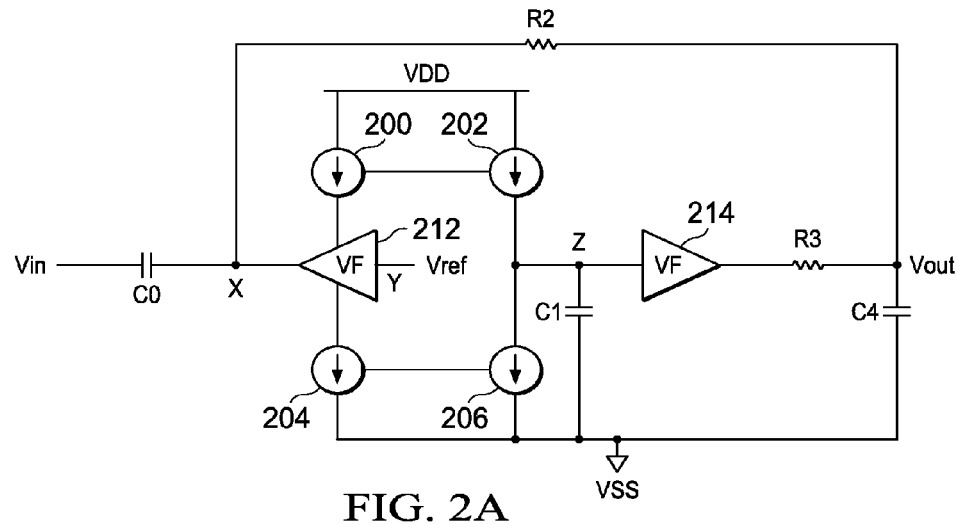
FIG. 2A is a circuit diagram of first embodiment of a bandpass sense amplifier of the present invention.

Referring to FIG. 2A, there is a bandpass sense amplifier circuit of the present invention which may be used as bandpass sense amplifier 612 (FIG. 6) for amplifying signals from a touch screen input device. An input capacitor C0 couples column sense circuit 610 (FIG. 6) to the sense amplifier. The sense amplifier includes a current conveyor circuit formed by current sources 200 through 206 and voltage follower circuit 212. The current conveyor circuit has a high impedance input terminal Y that is coupled to reference voltage Vref. Voltage follower circuit 212 reproduces voltage Vref at low impedance terminal X, hence the name voltage follower. Current sources 200 and 204 produce a current into terminal X that is mirrored into terminal Z by current sources 202 and 206, hence the name current conveyor. Terminal Z is coupled to an input terminal of voltage follower circuit 214 and to decoupling capacitor C1. Voltage follower 214 reproduces the voltage on terminal Z at a low impedance output terminal coupled to one terminal of resistor R3. The other terminal of resistor R3 is coupled to decoupling capacitor C4. Resistor R2 is coupled between terminal X and capacitor C4 and, together with voltage follower 214, produces output signal Vout.

Figure 2B:
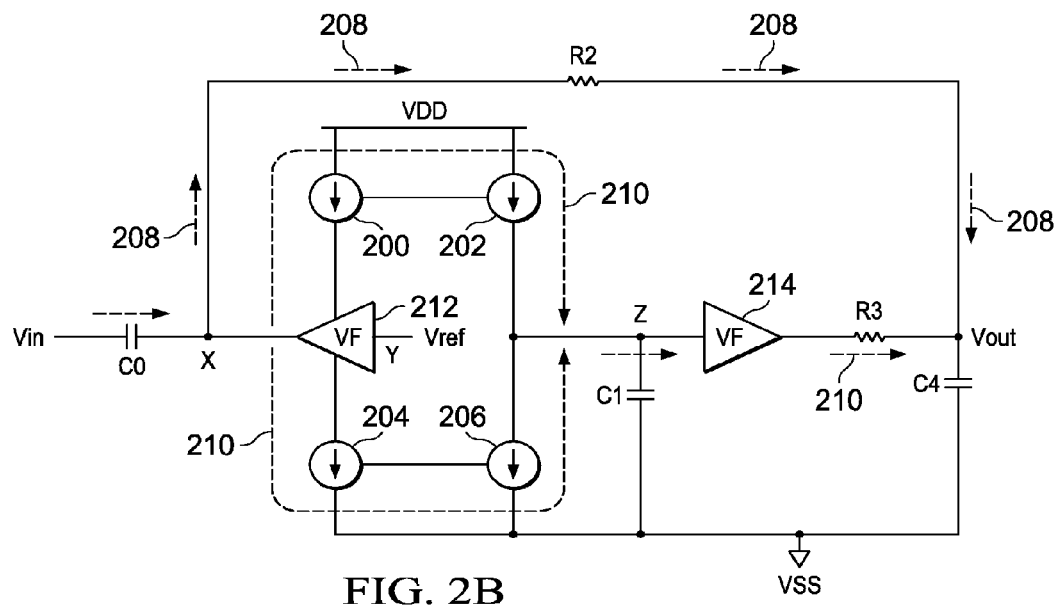
FIG. 2B is a diagram of the circuit of FIG. 2A showing high pass and low pass current paths.
Figure 2C:
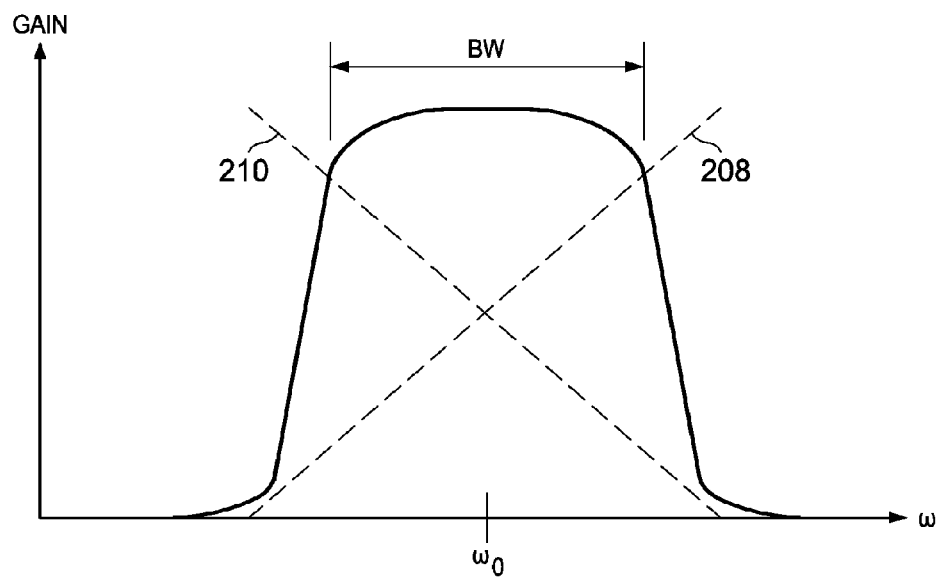
FIG. 2C is a diagram of bandpass characteristics of the circuit of FIG. 2A.

Operation of the circuit of FIG. 2A will now be explained with reference to FIGS. 2B and 2C. Input capacitor C0 is coupled to the output terminal at capacitor C4 through resistor R2 and forms a high pass filter between Vin and Vout along signal path 208. The high pass filter characteristic 208 is indicated at FIG. 2C. As previously mentioned, terminal X of the current conveyor circuit has a low output impedance similar to an alternating current (AC) ground. The current conveyor circuit, therefore, acts as a low pass filter along current path 210 and in series with high pass filter C0. The low pass filter characteristic 210 is indicated at FIG. 2C. The combined low and high pass filter characteristics, indicated by the solid line of FIG. 2C, form the bandpass characteristic of the bandpass sense amplifier. Current into terminal Z is integrated by capacitor C1 to produce an input voltage at voltage follower circuit 214. The high pass filter signal 208 is combined with the low pass filter signal 210 at capacitor C4 to produce output signal Vout. A Laplace transform of the transfer function of the bandpass sense amplifier of FIG. 2A is given by equation [7].

$$H(s) = \frac{-sR2C0}{s^2 R2R3C1C4 + s(R2R3)C1 + 1} \quad [7]$$

The center frequency and bandwidth of the circuit of FIG. 2A are given below in equations [8] and [9], respectively. The gain and Q factor are given by equations [10] and [11], respectively.

$$\omega_0 = \sqrt{\frac{1}{R2R3C1C4}} \quad [8]$$

$$BW = \frac{R2 + R3}{R2R3C4} \quad [9]$$

$$GAIN = \frac{-C0R2}{(R2 + R3)C1} \quad [10]$$

$$Q = \frac{1}{R2 + R3} \sqrt{\frac{R1R3C4}{C1}} \quad [11]$$

There are several significant advantages of the circuit of FIG. 2A over the prior art. First, there are fewer components. Only two resistors, two capacitors, and two active circuit blocks are required. The bandpass sense amplifier of FIG. 2A, therefore, generates less noise. Second, both voltage followers 212 and 214 are unity gain amplifiers and, therefore, produce less total harmonic distortion, a lower noise factor, and greater stability. Third, the center frequency $\omega_0$ only depends on R2, R3, C1, and C4. Bandwidth (BW) only depends on R2, R3, and C4. Gain only depends on R2, R3, and C1. There are fewer passive components and the same components control pass band characteristics of FIG. 2C. The bandpass sense amplifier of FIG. 2A, therefore, is much more tolerant to process variation than circuits of the prior art. Finally, the Q factor of equation [11] is much less complex than the prior art Q factor of equation [6]. This is important in control of frequency selectivity with process variation.

Figure 3:
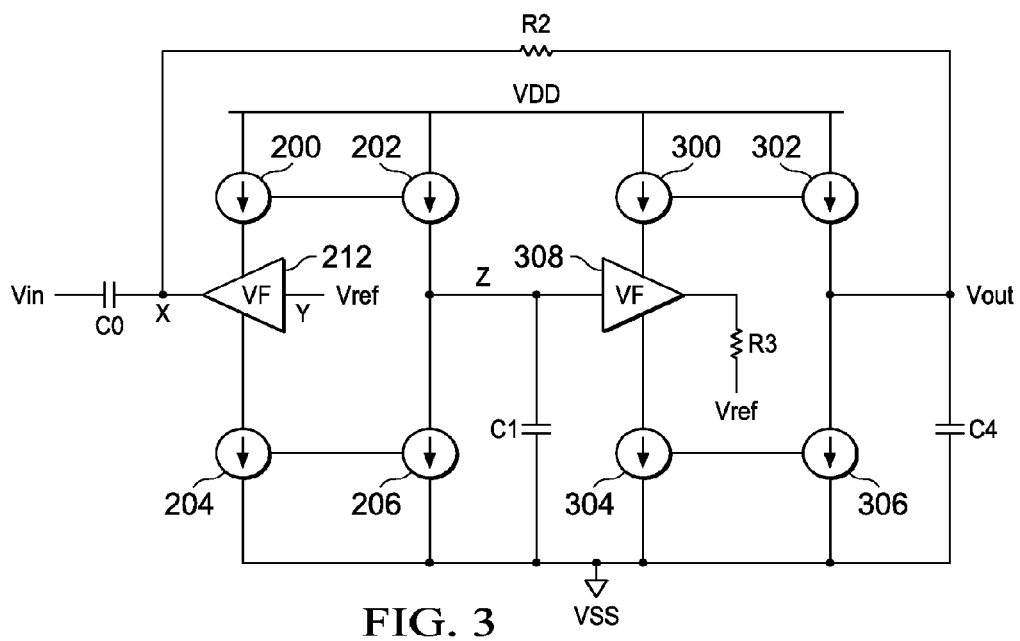
FIG. 3 is a circuit diagram of a second embodiment of a bandpass sense amplifier of the present invention.

Turning now to FIG. 3, there is a circuit diagram of a second embodiment of a bandpass sense amplifier of the present invention. This embodiment is similar to the embodiment of FIG. 2A. However, a second current conveyor circuit including current sources 300 through 306 and voltage follower circuit 308 replace voltage follower 214. Here, the voltage at terminal Z is reproduced at the output terminal of voltage follower 308. The current into the output terminal of voltage follower 308 from current sources 300 and 304 is mirrored into the sense amplifier output terminal at capacitor C4 by current sources 302 and 306. This circuit generates slightly more noise than the circuit of FIG. 2A but less than circuits of the prior art. However, it offers an advantage of increasing sense amplifier gain by either decreasing resistor R3 or increasing resistor R2. A Laplace transform of the transfer function of the bandpass sense amplifier of FIG. 3 is given by equation [12].

$$H(s) = \frac{-sR2C0}{s^2 R2R3C1C4 + sR3C1 + 1} \quad [12]$$

The center frequency and bandwidth of the circuit of FIG. 3 are given below in equations [13] and [14], respectively. The gain and Q factor are given by equations [15] and [16], respectively.

$$\omega_0 = \sqrt{\frac{1}{R2R3C1C4}} \quad [13]$$

$$BW = \frac{1}{R2C4} \quad [14]$$

$$GAIN = \frac{-C0R2}{R3C1} \quad [15]$$

$$Q = \sqrt{\frac{R2C4}{R3C1}} \quad [16]$$

Figure 4A:
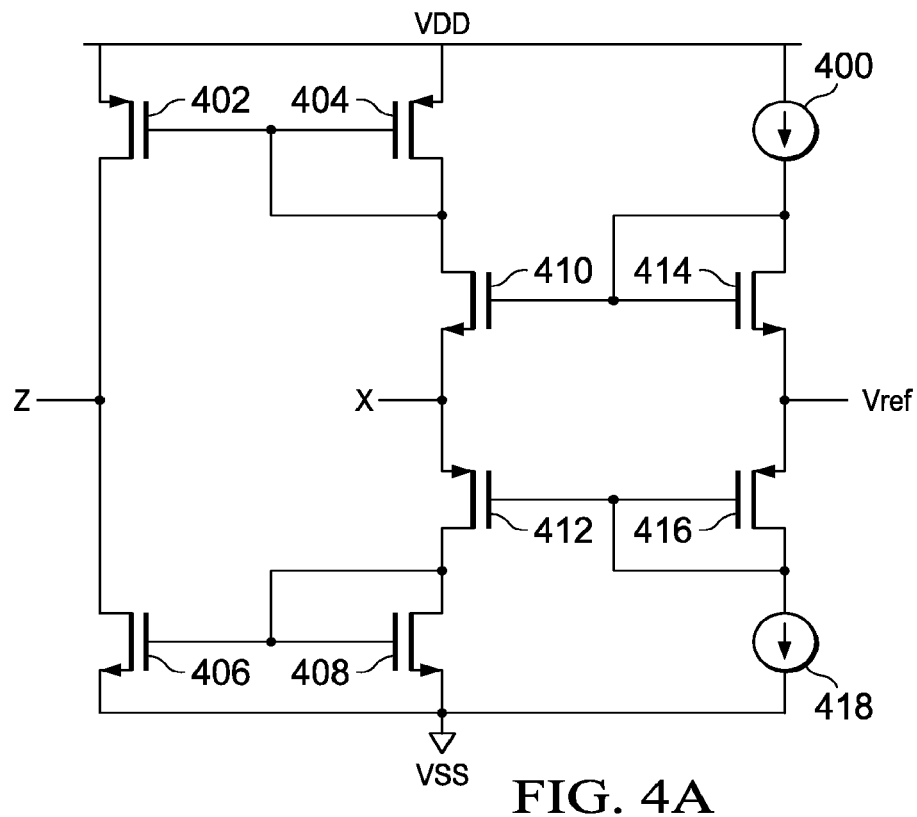
FIGS. 4A through 5B are circuit diagrams of the present invention that may be used with the bandpass sense amplifiers of FIGS. 2A and 3.

Referring next to FIG. 4A, there is a circuit diagram of a first embodiment of a current conveyor circuit that may be used with the bandpass sense amplifiers of FIGS. 2A and 3. The circuit includes p-channel transistors 402 and 404 connected in a current mirror configuration. The circuit further includes n-channel transistors 406 and 408 also connected in a current mirror configuration. Transistors 402 through 408 are equivalent to current sources 200 through 206 (FIGS. 2A and 3), respectively. N-channel transistors 410 and 414 and p-channel transistors 412 and 416 are configured as source followers. Together with current sources 400 and 418, they are equivalent to voltage followers 212 and 214 (FIG. 2A) and 308 (FIG. 3).

Figure 4B:
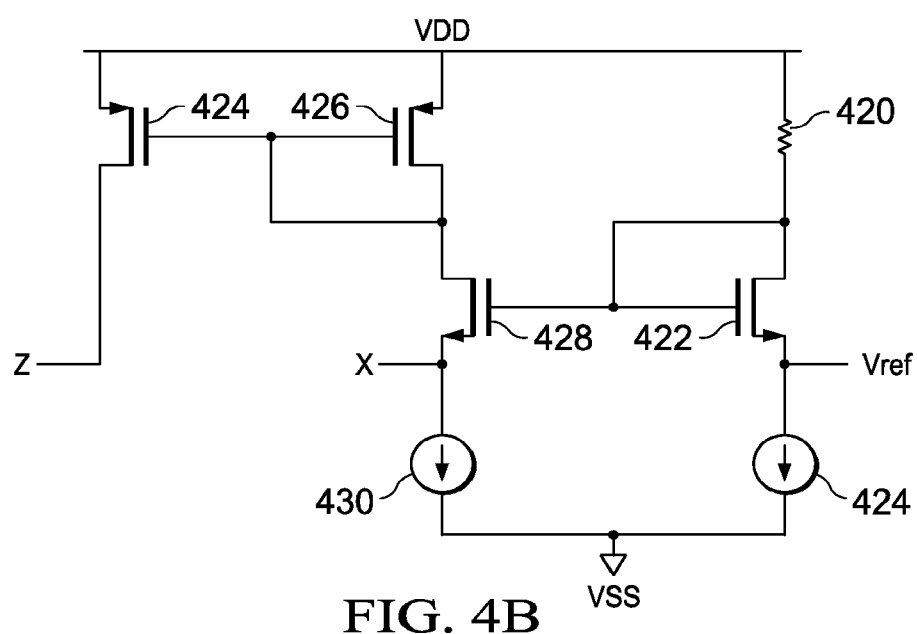

FIG. 4B is a circuit diagram of a second embodiment of a current conveyor circuit that may be used with the bandpass sense amplifiers of FIGS. 2A and 3. The circuit includes p-channel transistors 424 and 426 connected in a current mirror configuration to mirror terminal X current into terminal Z. N-channel transistors 428 and 422 are configured as source followers. Together with resistor 420 and current sources 430 and 424, they are equivalent to voltage followers 212 and 214 (FIG. 2A) and 308 (FIG. 3).

Figure 4C:
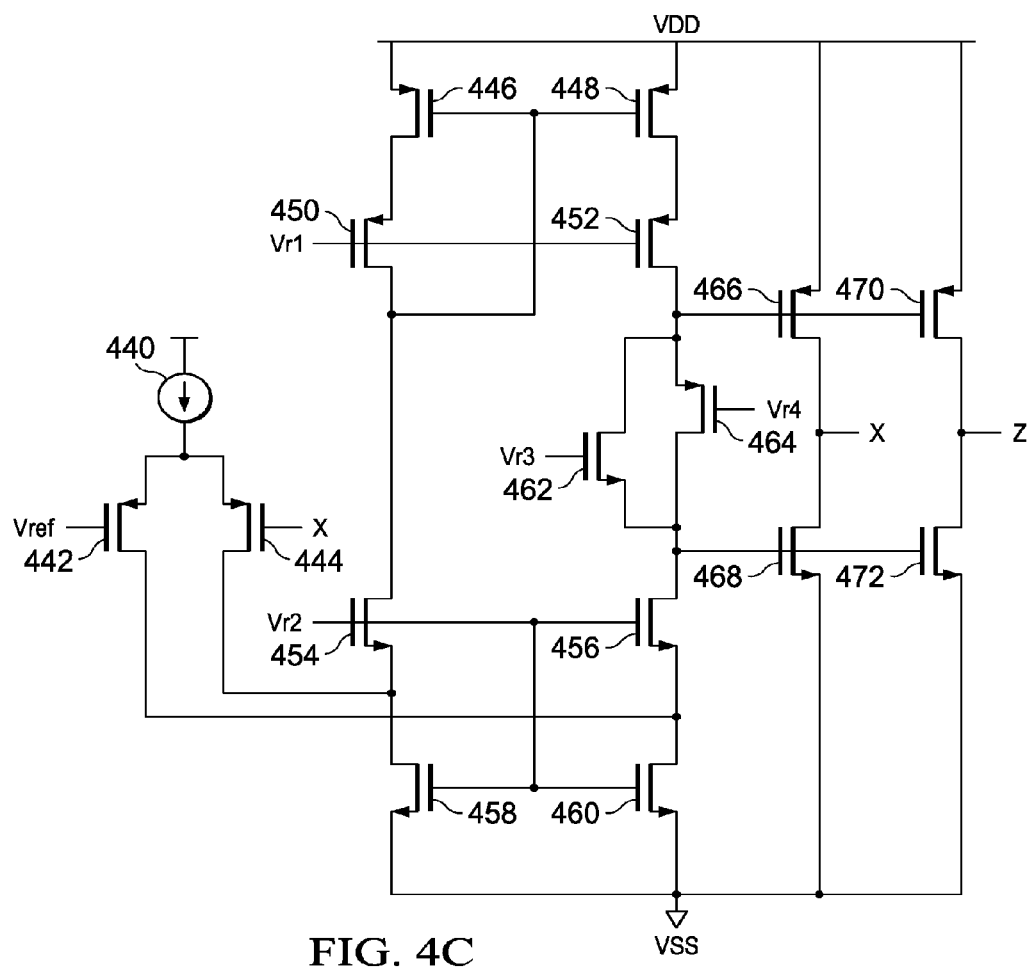

FIG. 4C is a circuit diagram of a third embodiment of a current conveyor circuit that may be used with the bandpass sense amplifiers of FIGS. 2A and 3. The circuit includes p-channel transistors 446 through 452 connected in a cascode current mirror configuration with gates of transistors 450 and 452 receiving reference voltage Vr1. N-channel transistors 454 through 460 are also connected in a cascode current mirror configuration with gates of transistors 454 and 456 receiving reference voltage Vr2. Current source 440 and p-channel transistors 442 and 444 form a differential input stage to the n-channel cascode current mirror circuit. N-channel transistor 462 and p-channel transistor 464 are coupled to receive respective gate reference voltages Vr3 and Vr4. An output stage of the current conveyor circuit is formed by p-channel transistors 466 and 470 and by n-channel transistors 468 and 472.

In operation, gate to source voltage of p-channel transistor 466 is always the same as gate to source voltage of p-channel transistor 470. Likewise, gate to source voltage of n-channel transistor 468 is always the same as gate to source voltage of n-channel transistor 472. Thus, current into terminal X is always mirrored into terminal Z. The common drain terminal X of transistors 466 and 468 is the same as gate terminal X of p-channel transistor 444 and forms a feedback loop to the differential input stage. Thus, an increase in voltage at the gate of p-channel transistor 444 with respect to reference voltage Vref increases current flow through the left branch (446,450,454,458) of the current mirror circuit. This increase in current flow is mirrored into the right branch (448,452,456,460) causing an increase in gate voltage of output transistors 466 through 472. This increase in gate voltage holds the gate of p-channel transistor 444 at the same voltage as reference voltage Vref. Likewise, a decrease voltage at the gate of p-channel transistor 444 with respect to reference voltage Vref decreases current flow through the left branch of the current mirror circuit. This decrease in current flow causing a corresponding decrease in gate voltage of output transistors 466 through 472. This decrease in gate voltage again holds the gate of p-channel transistor 444 at the same voltage as reference voltage Vref.

Figure 5A:
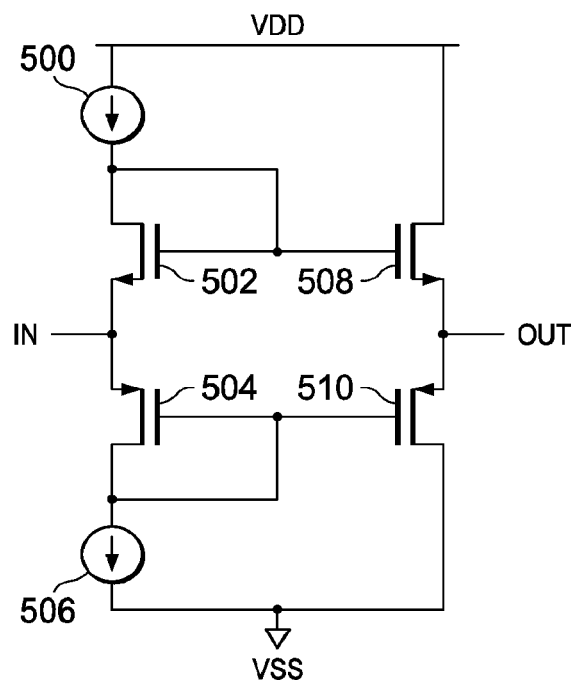

Referring now to FIG. 5A, there is a circuit diagram of a voltage follower circuit that may be used in the bandpass sense amplifiers of FIGS. 2A and 3. The voltage follower circuit is substantially the same as previously described with regard to FIG. 4A. N-channel transistors 502 and 508 are connected as a current mirror. Likewise, p-channel transistors 504 and 510 are also connected as a current mirror. Current sources 500 and 506 provide a bias current through transistors 502 and 504 and provide a high input impedance at terminal In. Any increase in voltage at terminal In decreases the gate to source voltage of n-channel transistor 502. A corresponding decrease in current through transistor 502 produces an increase in gate voltage of n-channel transistor 508 as well as an increase of output voltage at terminal Out. Likewise, any decrease in voltage at terminal In decreases the gate to source voltage of p-channel transistor 504. A corresponding decrease in current through p-channel transistor 504 produces a decrease in gate voltage of p-channel transistor 510 as well as a decrease of output voltage at terminal Out. Thus, voltage at output terminal Out follows the voltage at input terminal In.

Figure 5B:
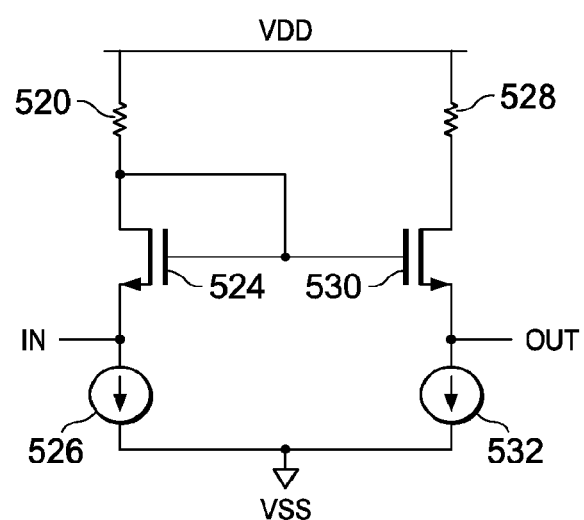

FIG. 5B is a circuit diagram of another voltage follower circuit that may be used in the bandpass sense amplifiers of FIGS. 2A and 3. N-channel transistors 524 and 530 are connected as a current mirror with drain terminals connected by resistors 520 and 528, respectively, to supply voltage VDD. Current sources 526 and 532 are connected between respective sources of n-channel transistors 524 and 530 and supply voltage VSS. Any increase in voltage at terminal In decreases the gate to source voltage of n-channel transistor 524. A corresponding decrease in current through transistor 524 produces an increase in gate voltage of n-channel transistor 530 as well as output voltage at terminal Out. Any decrease in voltage at terminal In increases the gate to source voltage of n-channel transistor 524. A corresponding increase in current through transistor 524 produces an increase in voltage across resistor 520 and a corresponding decrease in gate voltage of n-channel transistor 530 as well as a decrease in output voltage at terminal Out. Thus, voltage at output terminal Out follows the voltage at input terminal In.

Figure 1A:
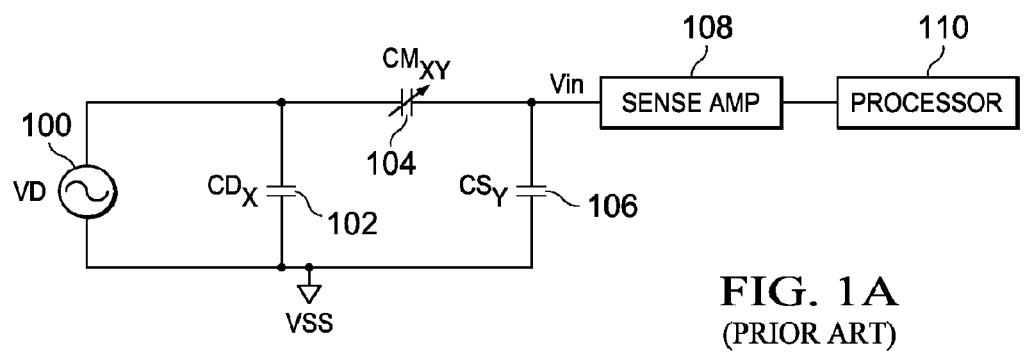
FIG. 1A is a circuit diagram of a touch screen system of the prior art.
Figure 1B:
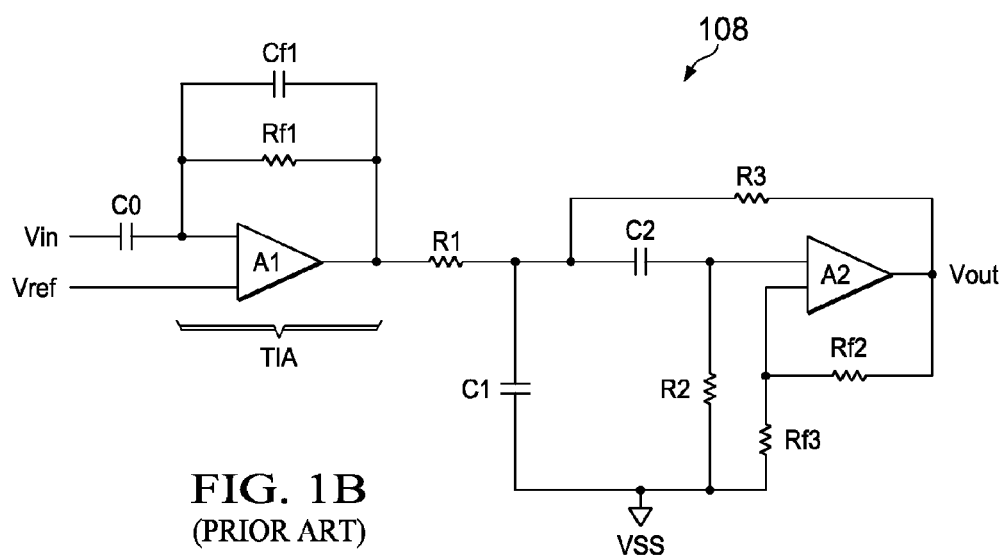
FIG. 1B is a circuit diagram of a sense amplifier of the prior art that may be used with the touch screen system of FIG. 1A.

Referring now to FIG. 7, there is a diagram comparing characteristics of the circuit of FIG. 1B with the circuits of FIGS. 2A and 3. Several significant advantages of the present invention are evident from this diagram. First, the bandpass sense amplifiers of FIGS. 2A and 3 have fewer capacitors and resistors than the circuit of FIG. 1B. This reduction in passive components reduces noise, circuit complexity, and die area. Second, noise at the center frequency of 115 KHz is approximately an order of magnitude less for the circuits of FIGS. 2A and 3 than for the prior art circuit of FIG. 1B. Third, noise over the entire passband from 90 KHz to 140 KHz is approximately an order of magnitude less for the circuits of FIGS. 2A and 3 than for the prior art circuit of FIG. 1B. Finally, there is no significant disadvantage to the circuits of FIGS. 2A and 3. All other circuit characteristics are comparable to the circuit of FIG. 1B.

Still further, while numerous examples have thus been provided, one skilled in the art should recognize that various modifications, substitutions, or alterations may be made to the described embodiments while still falling within the inventive scope as defined by the following claims. For example, although complementary metal oxide semiconductor (CMOS) devices have been shown in preferred embodiments of the present invention, one of ordinary skill in the art having access to the instant specification will appreciate that equivalent embodiments of the claimed invention may be designed with bipolar devices or a combination of bipolar and CMOS (BiCMOS) devices. Other combinations will be readily apparent to one of ordinary skill in the art having access to the instant specification.

The invention claimed is:
1. A circuit, comprising:
a capacitor having a first terminal coupled to receive an input signal and having a second terminal;
a first current conveyor circuit having a third terminal coupled to the second terminal of the capacitor and having a fourth terminal arranged to mirror a current into the third terminal; and
a second current conveyor circuit having an input terminal coupled to the fourth terminal of the first current conveyor circuit and having an output terminal arranged to mirror a current into the input terminal.
2. A circuit as in claim 1, comprising a low pass filter coupled to a high pass filter between the first terminal and the output terminal.
3. A circuit as in claim 2, wherein the low pass filter is coupled in series with the high pass filter.
4. A circuit as in claim 1, wherein the first current conveyor circuit comprises a first voltage follower circuit having the third terminal as an output terminal and having a fifth terminal coupled to receive a reference voltage.
5. A circuit as in claim 4, wherein the voltage follower circuit reproduces the reference voltage at the third terminal.
6. A circuit as in claim 1, wherein the second current conveyor circuit comprises a second voltage follower circuit coupled between the input terminal and a reference voltage terminal.
7. A circuit as in claim 1, wherein the first current conveyor circuit comprises a unity gain amplifier.
8. A touch screen system, comprising:
a voltage source arranged to produce a drive voltage having a frequency;
a plurality of first electrodes arranged to selectively receive the drive voltage;
a plurality of second electrodes proximate the plurality of first electrodes;
a bandpass sense amplifier, including a first current conveyor circuit and a first voltage follower circuit, selectively coupled to the plurality of second electrodes, the first current conveyor circuit including the first voltage follower circuit, and including a second current conveyor circuit, the second current conveyor circuit including a second voltage follower circuit;
an analog to digital converter (ADC) coupled to receive an output signal from the bandpass sense amplifier; and
a processor coupled to receive an output signal from the ADC.

9. A system as in claim 8, wherein the bandpass sense amplifier comprises a low pass filter coupled in series with a high pass filter.

10. A system as in claim 8, comprising:
   an input capacitor having a first terminal selectively coupled to the plurality of second electrodes and having a second terminal coupled to the first current conveyor circuit; and
   a resistor coupled between the second terminal and the second current conveyor circuit.

11. A system as in claim 8, comprising:
   an input capacitor having a first terminal selectively coupled to the plurality of second electrodes and having a second terminal coupled to the first current conveyor circuit; and
   a resistor coupled between the second terminal and the first voltage follower circuit.

* * * * *